United States Patent [19]

Garver et al.

[11] Patent Number: 4,864,258

[45] Date of Patent: Sep. 5, 1989

[54] RF ENVELOPE GENERATOR

[75] Inventors: Robert V. Garver, Boyds; Robert J. Tan, Beltsville, both of Md.

[73] Assignee: The United States of America as represented by the Secretary of the Army, Washington, D.C.

[21] Appl. No.: 188,943

[22] Filed: May 2, 1988

[51] Int. Cl.$^4$ .............................................. H04B 3/04
[52] U.S. Cl. ..................................... 333/20; 333/122; 333/137
[58] Field of Search .................. 333/20, 121, 122, 125, 333/137, 263, 253

[56] References Cited

U.S. PATENT DOCUMENTS 2,863,127  12/1958  Albersherm ...................... 333/20 X
3,612,899  10/1971  Ross et al. ........................ 333/20 X
3,735,146   5/1973  Blore et al. ....................... 333/20 X

FOREIGN PATENT DOCUMENTS 3242975  6/1984  Fed. Rep. of Germany ........ 333/20
8605032  8/1986  PCT Int'l Appl. ................... 333/20
0649067  1/1951  United Kingdom ................. 333/122

OTHER PUBLICATIONS

Tan et al., "High-Power, Short-Pulse Forming Circuits," IEEE MTS-S, International Microwave Symposium Digest, vol. 1, 9–11, Jun. 1987, pp. 399–402.

Primary Examiner—Eugene R. LaRoche
Assistant Examiner—Seung Ham
Attorney, Agent, or Firm—Saul Elbaum; Guy M. Miller; Muzio B. Roberto

[57] ABSTRACT

A microwave rf envelope generator or pulse shaper has a main waveguide with two opposing branches connected in shunt to the main waveguide and are terminated with variable positionable shorts. The characteristic impedance of the shunted combination of the two branches equal one half the characteristic impedance of the main waveguide. An incident rf pulse applied to an input of the main waveguide is transmitted to a four way junction formed at the intersection of the two branches. The incident pulse is divided at the junction. Divided pulses are then transmitted down each of the branches and to an output of the main waveguide. The pulses traveling down each branch will have their phases shifted when they are reflected by the variable positionable shorts. The lengths of the branches are adjusted by the variable shorts so that the phase of the reflected and inverted pulses will cancel the trailing portion of the pulse transmitted out towards the output of the main waveguide. The output pulse width is a function of the time it takes the divided pulses to travel down the branches and back.

7 Claims, 2 Drawing Sheets

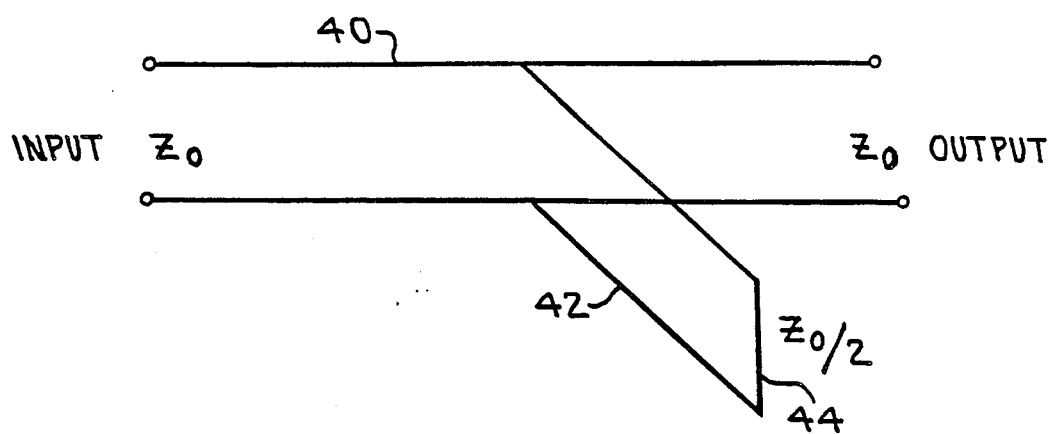
FIG. 2
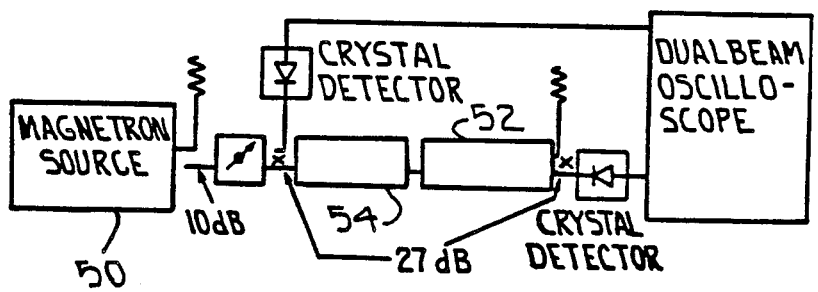
FIG. 3
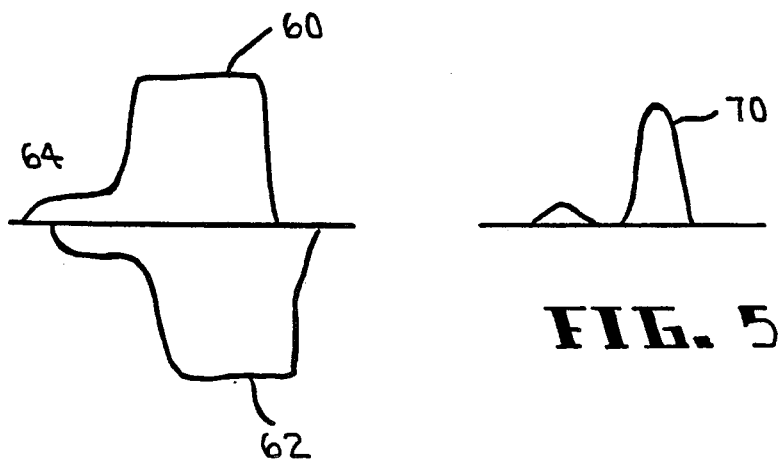
FIG. 4
FIG. 5

RF ENVELOPE GENERATOR

RIGHTS OF THE GOVERNMENT

The invention described herein may be manufactured, used and licensed by or for the U.S. Government for Governmental purposes without payment to us of any royalty thereon.

BACKGROUND OF THE INVENTION

1. Field of the Invention

The present invention relates to fast-rise-time microwave signal devices and more particularly to a nanosecond rf envelope generator or pulse shaping network that is passive, in-line, and broadband.

2. Description of the Prior Art

Fast-rise-time, high power microwave (HPM) pulses from high performance radars may be able to pass through electronic protection devices such as diode limiters before these devices turn on, thereby potentially damaging receiver from ends. The pulse leaking past a protection device may be quite short in duration and significantly high in power (10 to 100 kW). Devices like PIN diode limiters, terminal protection devices and other similar systems react differently when subjected to these fast rising, short duration, pulses. Studying the spike leakage and damage threshold of these devices is necessary so that they can be optimally protected. Consequently, there is a great need to test these electronic systems with fast-rise-time, short duration, HPM pulses in order to understand and improve their immunity.

Present devices for forming short duration rf pulses from "long duration" rf signals include diode switches and laser switched semiconductors. However, diode switches only work at low power and laser switched semiconductors require a large and expensive laser.

From the above, it may be appreciated that there is a great need for an easy to use device that produces a short duration, HPM pulse for testing purposes.

SUMMARY OF THE INVENTION

In accordance with the present invention, a nanosecond rf envelope generator (NREG) or pulse shaping device works on the principle of having a shunted, shorted line with half the characteristics impedance of the input and output. The present embodiment for accomplishing this principle comprises adding another arm or branch to an H-plane tee waveguide forming an "H-plane cross". The two branches then have their ends connected to variable shorts. The two branches, in shunt, combine to represent a shunted line having one half the characteristic impedance of the input and output of the main waveguide section in the H-plane cross.

More specifically the NREG is a device that will give an output pulse of any width given an input pulse with a sufficiently fast rise time. The envelope generator includes adjustable variable shorts connected to the ends of the shunted branches. The variable shorts are adjusted equally and in phase so that the trailing portion of the pulse transmitted to the output will be canceled by the pulses reflected and inverted (in the case of video pulses) or shifted a multiple of 180° (in the case of ac signals) in the branches.

The envelope generator was made in X-band waveguide and therefore operates from about 8 to 12 GHz. The envelope generator is an in-line and passive device having the advantage that it works with conventional rf sources, and unlike cavity methods does not need an input with high spectral purity.

Other and important objects will be apparent to those skilled in this art from the following description when considered with the appended drawings.

BRIEF DESCRIPTION OF THE DRAWINGS

FIG. 2 shows a schematic of the envelope generator of FIG. 1.

FIG. 3 shows a circuit block diagram of a test setup for using the envelope generator of FIG. 1.

FIG. 4 shows an example of internal pulse of the envelope generator of FIG. 1 used to create an output pulse.

FIG. 5 shows an output pulse generated by the envelope generator according to the present invention.

DESCRIPTION OF THE PREFERRED EMBODIMENTS

Figure 1:
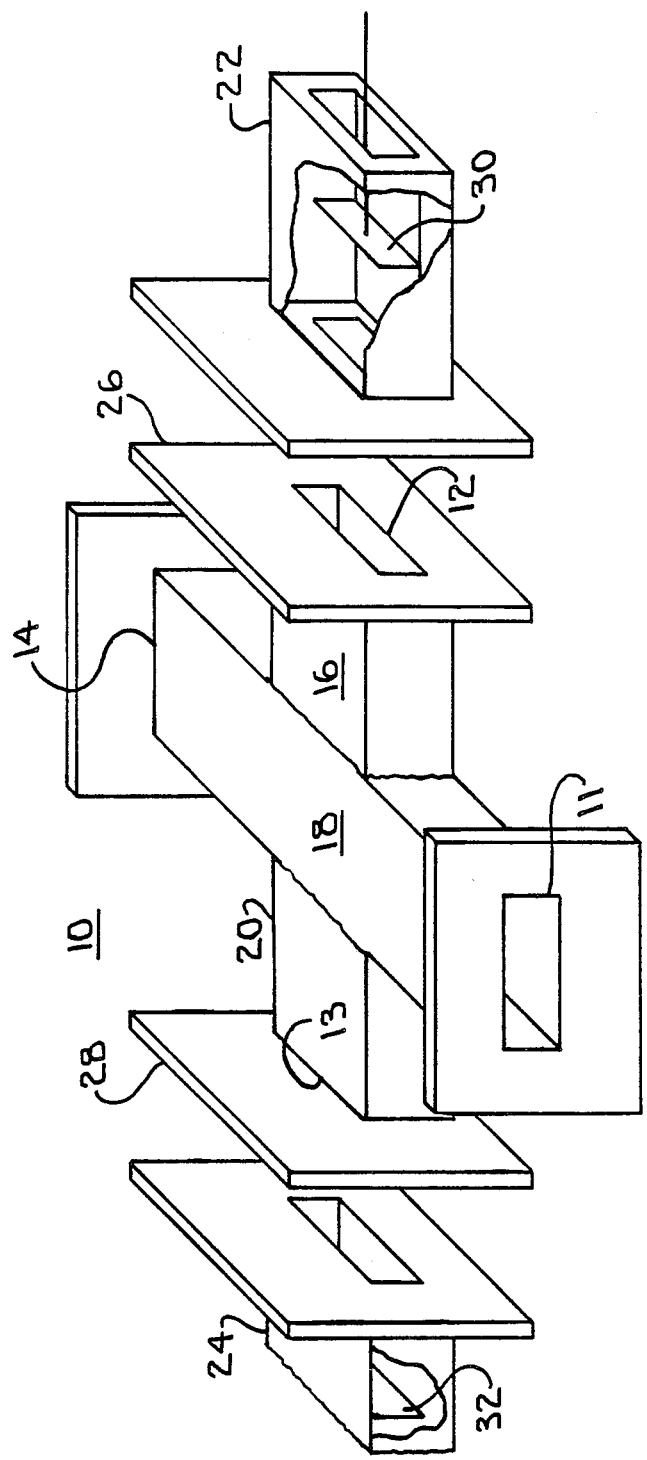
FIG. 1 shows an exploded pictorial view, partially in section, of an "H-plane" envelope generator according to an embodiment of the invention.

Referring now to the drawings, FIG. 1 shows a microwave rf envelope generator or pulse shaping device 10 made in X-band waveguide having an input port 11, output port 14 and branch ports 12 and 13. An X-band waveguide is used merely for example as different band waveguides and transmission lines may be used to perform the same functions. The envelope generator 10 is constructed by adding a branch waveguide 16, to a prior art H-plane tee cmoprised of a main waveguide section 18 and branch waveguide 20, thereby forming an "H-plane cross." The branches 16 and 20 each have one end connected in shunt to the main waveguide section 18 and terminate at ends 26 and 28 respectively. The position along the main waveguide section 18 in which the branches 16 and 20 are located is not critical to the invention. However, the branches 16 and 20 are positioned on the main waveguide section 18 opposing one another. Variable positionable shorts 22 and 24 are connected to branches 16 and 20 at ends 26 and 28 respectively for shorting the branches 16 and 20. The variable shorts 22 and 24 are used to adjustably position the effective length of the branches 16 and 20 by the positioning of shorting plungers 30 and 32 respectively.

FIG. 2 shows the equivalent circuit of FIG. 1. The equivalent circuit shows a transmission line 40 that has a parallel branch 42 that is terminated at a short 44. The parallel branch 42 is designed to have one half ($Z_o/2$) the characteristic impedance ($Z_o$) of the input and output of the transmission line 40. Therefore, an envelope generator may be designed with only one branch waveguide that has a characteristic impedance equal to one half of the impedance of the main waveguide section or a plurality of branches whose impedances combine in shunt to equal one half of the impedance of the main waveguide section. However, the dimensions of the single branch waveguide, or multiple branch waveguides (more than two) will be different that those of the main waveguide section in order to achieve the proper impedance.

The rf envelope generator 10 was tested in the arrangement shown in FIG. 3. A magnetron source 50 delivers a HPM pulse to the rf envelope generator 52 through an expander 54 that shortens the rise time of the magnetron pulse. However, the expander 54 is not essential for the rf envelope generator 10 to work. The operation of the rf envelope generator 52 will now be described by referring back to FIG. 1.

An rf pulse having a predetermined magnitude and width is applied to the rf envelope generator 10 at input port 11. The pulse travels down the main waveguide section 18 to the branch waveguide sections 16 and 20. The area in which the branch waveguide sections 16 and 20 are connected to the main waveguide forms a four way H-plane junction. The incident power of the rf pulse is divided at the four way junction. One fourth of the power is reflected back towards input port 11, one fourth being transmitted out towards output port 14 and one fourth being transmitted in each branch waveguide sections 16 and 20. In other words, since the branch waveguides 16 and 20 impedances represent one half the characteristic impedance of the input and output of the main waveguide section 18, when an incident pulse with a predetermined voltage hits the four way junction a pulse with one half the voltage of the incident pulse is reflected back towards the input port 11, a pulse with one half the voltage of the incident pulse is transmitted out towards output port 14 and pulses with one half the voltage of the incident pulse are transmitted down each of the branch waveguide sections 16 and 20. The pulses traveling down branch waveguide sections 16 and 20 will have their phases shifted when they are reflected by the variable shorts 22 and 24 respectively. The lengths of the branches 16 and 20 are adjusted by variable shorts 22 and 24 using positioning members 30 and 32 so that the phase of the reflected pulses will cancel the pulse transmitted out towards output port 14 when the shifted pulses reach the four way junction. In other words, the shifted pulses are inverted in relation to the original input pulse. The inverted pulses with one half the voltage of the incident pulse then combine at the four way junction. This new inverted pulse, having a voltage equal (but inverted) to the original incident pulse, is divided among all the branches creating inverted pulses with voltages equal to one half of the voltage of the original incident pulse. One of these inverted pulses cancels the trailing portion of the one half voltage pulse that is transmitted out towards the output port 14. Thus the rf envelope generator 10 uses voltage cancelation to shape the output rf pulse. The position of the plungers 30 and 32 in variable shorts 22 and 24 adjust the output pulse width by controlling the time it takes for the inverted pulses from the branch waveguide sections 16 and 20 to reach the four way junction. Consequently, the output pulse width is a function of the time that it takes the divided pulses to travel down branches 16 and 20 and back. Additionally, if only a single pulse width is desired at the output, the variable shorts 22 and 24 could be replaced with fixed shorts at the desired positions.

An example of what happens to a typical pulse that is transmitted towards the output port 14 when it is combined with the inverted branch pulses from branch waveguide sections 16 and 20 is shown in FIGS. 4 and 5. In FIG. 4 the pulse 60 is shown in relative position to the inverted pulse 62 (created by the reflected pulses from the branch waveguides) at the four way junction of the main waveguide section 18. FIG. 5 shows the resulting output pulse 70, that is transmitted to output port 14, as a result of the combination of pulses 60 and 62.

The rf envelope generator 10 also suppresses "front porch" power associated with fast rising pulses. An example of the "front porch" power is shown in FIG. 4 at 64. When the rise time or fall time is slow, the phase of the short circuits on the branches provides a measure of suppression. When the pulse rise time is T and the delay of a branch waveguide is t, the suppression is 20 log T/t. As can be seen in FIG. 5, the initial "front porch" pulse has been suppressed. Therefore, the envelope generator not only gives a pulse of controlled width, but enhances the definition of the pulse above preceding power.

While the invention has been described with reference to one particular embodiment, the invention also includes all variations, substitutions and modifications as will be obvious to those skilled in the art within the spirit and scope of the invention, its description or claims. For example, the invention is susceptible of numerous variants and, in particular may be built in waveguide, stripline, or in a coaxial line.

What is claimed is:

1. A pulse shaping device comprising:
    a main waveguide section with a predetermined characteristic impedance having an input and an output;
    means for coupling a microwave signal source to said input of said main waveguide section, said microwave signal source generating an input rf pulse having a predetermined magnitude and width in which the rf pulse carrier wavelength is lambda;
    a branch waveguide section with a characteristic impedance equal to one half the characteristic impedance of said main waveguide section having an end connected in shunt to said main waveguide section and a shorted end, said branch waveguide section forming a junction with said main waveguide section for dividing said input rf pulse into a first divided rf pulse which is transmitted towards said output of said main waveguide section and a second divided rf pulse which is transmitted towards the shorted end of said branch waveguide section; and
    means for controlling the length of said branch waveguide section by adjustably positioning the shorted end of said branch waveguide section, the length of said branch waveguide being adjusted such that the carrier wavelength lambda within said second divided rf pulse is shifted a multiple of 180 degrees when said second divided rf pulse is reflected at the shorted end of said branch waveguide section so that the trailing portion of said first divided rf pulse is canceled before said first divided rf pulse is transmitted to said output of said main waveguide, whereby the width of said input rf pulse is shortened.

2. The pulse shaping device of claim 1 wherein said main waveguide section is a rectangular waveguide.

3. The pulse shaping device of claim 2 wherein said branch waveguide section is a rectangular waveguide.

4. A pulse shaping device comprising:
    a main waveguide section with a predetermined characteristic impedance having an input and an output;
    means for coupling a microwave signal source to said input of said main waveguide section, said microwave signal source generating an input rf pulse having a predetermined magnitude and width in which the rf pulse carrier wavelength is lambda;
    a first branch waveguide section having an end connected in shunt to said main waveguide section and a shorted end;
    first means for controlling the length of said first branch waveguide section by adjustably positioning the shorted end of said first branch waveguide section;

a second branch waveguide section having an end connected in shunt to said main waveguide section opposing said first branch waveguide section and a shorted end;

second means for controlling the length of said second branch waveguide section by adjustably positioning the shorted end of said second branch waveguide section, said first and second branch waveguide sections forming a junction with said main waveguide section for dividing said input rf pulse into a first divided rf pulse which is transmitted towards said output of said main waveguide section, a second divided rf pulse which is transmitted towards the shorted end of said first branch waveguide section, and a third divided rf pulse which is transmitted towards the shorted end of said second branch waveguide section, said first and second branch waveguide sections having characteristic impedances that equal to the characteristic impedance of said main waveguide section and lengths equally adjusted such that the carrier wavelength lambda within said second and third divided rf pulses is shifted a multiple of 180 degrees when said second and third divided rf pulses reflect at the shorted ends of said first and second branch waveguide sections so that the trailing portion of said first divided rf pulse is canceled before said first divided rf pulse is transmitted to said output of said main waveguide.

5. The pulse shaping device of claim 4 wherein said main waveguide section is a rectangular waveguide.

6. The pulse shaping device of claim 5 wherein said first and second branch waveguide sections are rectangular waveguides.

7. A method of shaping an rf pulse having a predetermined magnitude and width in which the rf pulse carrier wavelength is lambda, comprising the steps of:

applying a series of said rf pulses to a waveguide at an input of said waveguide, said waveguide having first and second opposing shunted waveguide branches forming a four way H-plane junction in said waveguide, each waveguide branch terminating with adjustable positionable shorts; wherein each rf pulse is transmitted down said waveguide to said four way H-plane junction where each rf pulse is divided into first, second, third and fourth pulses, each divided pulse having a magnitude equal to one half the magnitude of said rf pulse, each first divided pulse being transmitted back towards said input end, each second divided pulse being transmitted down said first waveguide branch, each third divided pulse being transmitted down said second waveguide branch, and each forth divided pulse being transmitted towards an output end of said waveguide;

observing each forth divided pulse at said output end of said waveguide;

canceling the trailing portion of each forth divided pulse by adjusting said adjustable positionable shorts until the width of each forth divided pulse has been shortened as desired; wherein each second and third divided pulses, after each second and third divided pulses have been transmitted down said first and second waveguide branches, are reflected so that the carrier wavelength lambda within said second and third divided pulses is shifted a multiple of 180 degrees at said adjustable positionable shorts of said first and second branches and transmitted back towards said four way junction where they combine to cancel the trailing portion of said forth divided pulse.

* * * * *